(12) United States Patent
Ha

(10) Patent No.: US 12,490,580 B2
(45) Date of Patent: Dec. 2, 2025

(54) DISPLAY DEVICE INCLUDING A GROUND PATH UNIT

(71) Applicant: LG Display Co., Ltd., Seoul (KR)

(72) Inventor: Dahye Ha, Chilgok-gun (KR)

(73) Assignee: LG Display Co., Ltd., Seoul (KR)

( * ) Notice: Subject to any disclaimer, the term of this patent is extended or adjusted under 35 U.S.C. 154(b) by 530 days.

(21) Appl. No.: 17/976,577

(22) Filed: Oct. 28, 2022

(65) Prior Publication Data

US 2023/0209867 A1 Jun. 29, 2023

(30) Foreign Application Priority Data

Dec. 29, 2021 (KR) .................. 10-2021-0191389

(51) Int. Cl.
| | | |
|---|---|---|
| *H10K 50/84* | (2023.01) | |
| *B60K 35/23* | (2024.01) | |
| *B60K 35/28* | (2024.01) | |
| *B60K 35/40* | (2024.01) | |
| *B60K 35/60* | (2024.01) | |
| *H10K 50/87* | (2023.01) | |
| *B60K 35/22* | (2024.01) | |

(52) U.S. Cl.
CPC ............. *H10K 50/84* (2023.02); *B60K 35/23* (2024.01); *B60K 35/28* (2024.01); *B60K 35/40* (2024.01); *B60K 35/60* (2024.01); *H10K 50/87* (2023.02); *B60K 35/22* (2024.01)

(58) Field of Classification Search
CPC ............................ H10K 50/84; H10K 50/87
See application file for complete search history.

(56) References Cited

U.S. PATENT DOCUMENTS

| | | | |
|---|---|---|---|
| 10,571,764 B2 | 2/2020 | Lim et al. | |
| 11,540,430 B2 | 12/2022 | Ha | |
| 11,958,275 B2* | 4/2024 | Park | ...................... B32B 15/04 |
| 12,089,381 B2 | 9/2024 | Ha | |
| 2021/0026590 A1 | 1/2021 | Nam et al. | |
| 2023/0018493 A1* | 1/2023 | Sung | ..................... H10K 77/10 |

FOREIGN PATENT DOCUMENTS

| | | | |
|---|---|---|---|
| CN | 109426044 A | | 3/2019 |
| CN | 113050315 A | | 6/2021 |
| KR | 20090030460 A | * | 3/2009 |
| KR | 20200039858 A | | 4/2020 |
| KR | 102127882 B1 | | 6/2020 |
| KR | 20210086029 A | | 7/2021 |

* cited by examiner

*Primary Examiner* — Joseph L Williams
(74) *Attorney, Agent, or Firm* — Seed Intellectual Property Law Group LLP

(57) ABSTRACT

Disclosed is a display device including a display panel including a display area and a non-display area surrounding the display area; a back plate disposed on one face of the display panel and including a first ground path unit; and a heat-dissipation plate disposed on a back face of the back plate and including a second ground path unit, wherein the first ground path unit covers at least each of corners of the back plate, wherein the second ground path unit vertically overlap the first ground path unit.

13 Claims, 10 Drawing Sheets

DISPLAY DEVICE INCLUDING A GROUND PATH UNIT

BACKGROUND

Technical Field

The present disclosure relates to a display device, and relates to a display device capable of preventing display panel quality deterioration due to static electricity in a vehicle display device.

Description of the Related Art

Display devices are being applied to various electronic devices such as TVs, mobile phones, laptops, and tablets. To this end, research to develop thinner, lighter and lower power consuming display devices, etc., is continuing.

The display device may include a liquid crystal display device (LCD), a plasma display device (PDP), a field emission display device (FED), an electro-wetting display device (EWD) and an organic light-emitting display device (OLED).

The organic light-emitting display device (OLED) includes a plurality of pixel areas disposed in a display area in which an image is displayed and a plurality of organic light-emitting elements corresponding to the plurality of pixel areas. Because the organic light-emitting element is self-emissive that emits light by itself, the organic light-emitting display device may have faster response speed, greater luminous efficiency, luminance and viewing angle, and excellent contrast ratio and color gamut compared to the liquid crystal display device.

Due to the above advantages of the organic light-emitting display device, OLED is widely used not only in electronic devices such as TVs, mobile phones or laptops, but also in other electronic devices. An application trend of the organic light-emitting display device to a vehicle user interface in increasing as electronicization of the vehicle accelerates. For example, the organic light-emitting display device is being used to implement a vehicle display device such as a vehicle dashboard (or cluster) that provides necessary information to a driver, navigation, or audio multimedia information.

BRIEF SUMMARY

Inventors recognized that in the display device for a vehicle including the vehicle dashboard, the user's convenience and safety must be considered. Thus, it is important to provide a good quality display panel.

One embodiment of the present disclosure provides a display device that may prevent deterioration of display panel quality due to static electricity generated in a process of peeling a releasing film before bonding a back plate and a display panel to each other.

One embodiment of the present disclosure provides a display device that may improve a heat-dissipation function and the display device may effectively dissipate heat generated from the display panel while a vehicle drives.

One embodiment of the present disclosure provides a display device that may absorb or mitigate vibration or shock transmitted toward a display panel while the vehicle drives.

Technical benefits of the present disclosure are not limited to the above-mentioned technical benefits. Other technical features and advantages of the present disclosure that are not mentioned may be understood based on following descriptions, and may be more clearly understood based on illustrated embodiments of the present disclosure.

A display device according to one embodiment of the present disclosure includes a display panel including a display area and a non-display area; a back plate disposed on one face of the display panel and including a first ground path unit; and a heat-dissipation plate disposed on a back face of the back plate, and including a second ground path unit, wherein the first ground path unit covers at least each of corners of the back plate, and the second ground path unit is disposed to vertically overlap the first ground path unit.

According to one embodiment of the present disclosure, the first ground path unit disposed on the back plate and the second ground path unit disposed on the heat-dissipation plate may be introduced to discharge, to an outside, static electricity generated in a process of peeling a releasing film before bonding the back plate and the display panel to each other.

Accordingly, the static electricity may be prevented from flowing into the display panel and thus from causing a static electricity induced spot, such that quality of the display panel may be uniform.

Further, placing the first ground path unit on an edge area of the back plate so as not to overlap the display area of the display panel may provide an advantage of preventing yellowing or greenish phenomenon of the display panel.

Further, a plurality of the second ground path units having a concave trench shape may be formed in a metal substrate of the heat-dissipation plate, thereby increasing an exposed surface area of the metal substrate and thus improving the heat-dissipation effect.

In addition, the plurality of the second ground path units having a concave trench shape may be formed in the metal substrate of the heat-dissipation plate, thereby preventing or reducing vibration and shock from being transmitted to a light-emitting element layer of the display panel.

In addition, the first ground path unit may have a larger thickness than that of the display panel, and the display panel may be disposed at an inner side of the first ground path unit, thereby absorbing and alleviating the vibration or shock transmitted toward a side face of the display panel while the vehicle drives.

Effects of the present disclosure are not limited to the above-mentioned effects, and other effects as not mentioned will be clearly understood by those skilled in the art from following descriptions.

DETAILED DESCRIPTIONS

Figure 1:
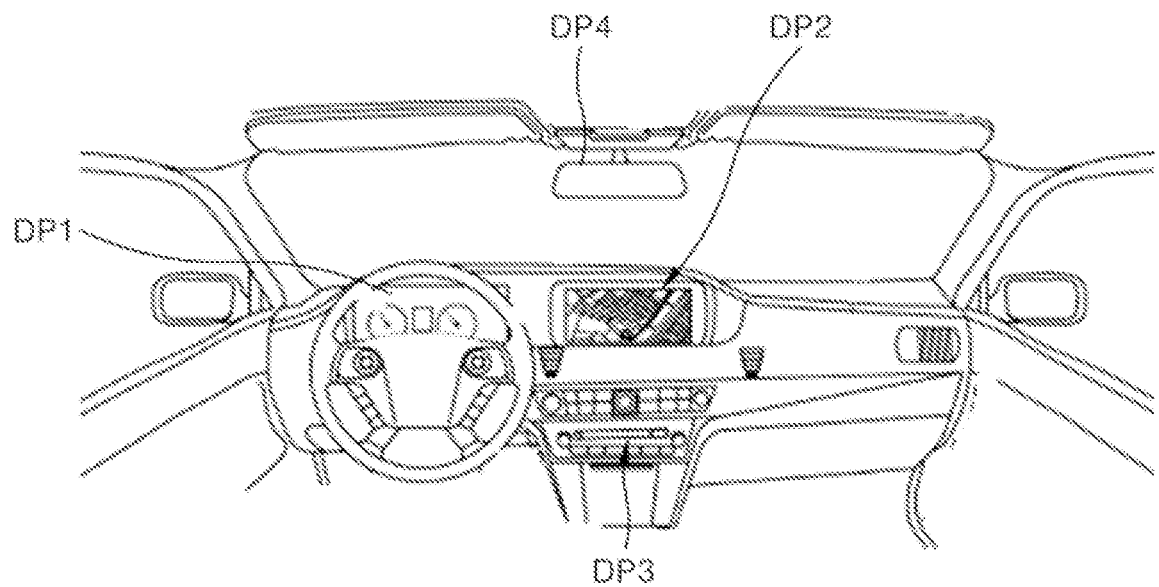
FIG. 1 is a diagram showing an application configuration of a display device according to one embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which the present disclosure belongs.

A shape, a size, a ratio, an angle, a number, etc., disclosed in the drawings for describing the embodiments of the present disclosure are examples, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise," "including," "include," and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after," "subsequent to," "before," etc., another event may occur therebetween unless "directly after," "directly subsequent" or "directly before" is not indicated.

It will be understood that, although the terms "first," "second," "third," and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to," or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
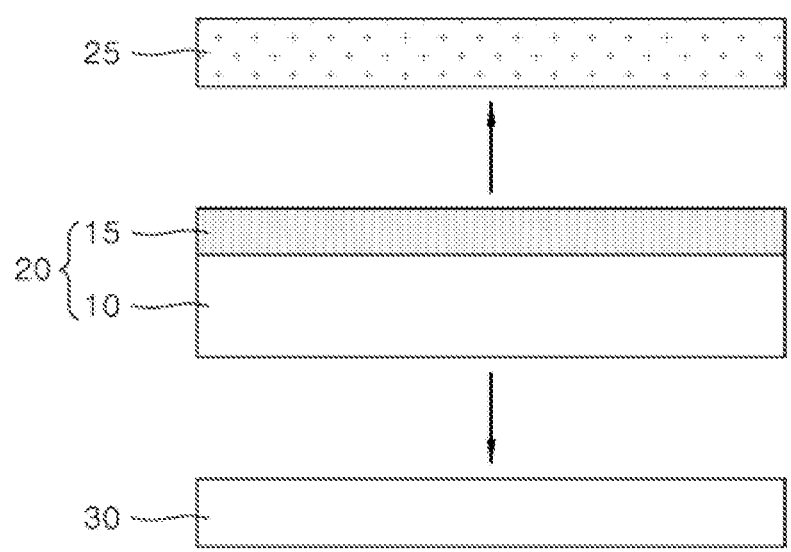
FIGS. 2 to 4 are diagrams to illustrate a static electricity induced spot defect that may occur in a display panel.
Figure 3:
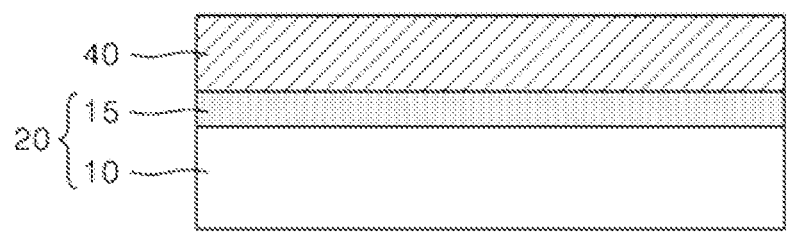
Figure 4:
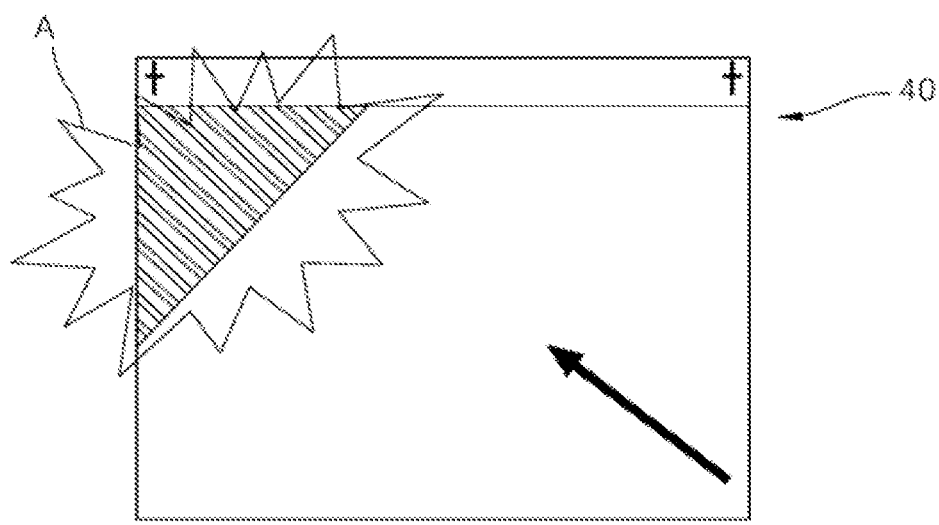

FIG. 1 is a diagram showing an application configuration of a display device according to one embodiment of the present disclosure. FIGS. 2 to 4 are diagrams to illustrate static electricity induced spot defects that occur in a display panel.

Referring to FIG. 1, a display device according to one embodiment of the present disclosure may be applied to a vehicle dashboard DP1, a navigation device DP2, a center fascia DP3 or a room mirror display device (DP4) mounted on a vehicle. Further, although not shown in the drawing, the display device may be mounted at a position where the display device may be applied. For example, the display device may be applied, for example, as a side mirror or a head-up display inside the vehicle so as to provide information to the driver.

When the display device is mounted inside the vehicle, the display panel of the display device is always exposed to vibration and shock due to characteristics of an environment around which the vehicle is running. Further, when the vehicle moves outdoors, the display device should be able to accurately deliver necessary information to the driver while being exposed to sunlight. Accordingly, the display panel should be able to provide an image of uniform quality in a situation where the vibration and impact are applied thereto and the display device is exposed to the sunlight.

A large-area display panel introduced into a vehicle display device may include a substrate made of a plastic material with excellent elasticity. In one example, the substrate of the display panel may include a flexible plastic material such as polyimide (PI). The substrate including the plastic material is very thin and thus it is difficult to handle the substrate. For this reason, a glass substrate as a support substrate may be placed under the plastic material substrate, and then pixels and driver circuit elements may be formed on the plastic material substrate, and then the glass substrate may be removed therefrom.

For example, a circuit element for driving a display panel including the pixel may be formed on a display substrate including a plastic material. Then, an encapsulation process to protect the components may be carried out, and then a laser lift off (LLO) process may be performed in which laser may be irradiated to a bottom of the glass substrate to remove the display substrate from the glass substrate. Because the display substrate separated from the glass substrate is very thin and thus it is difficult to handle the same, a back plate that may serve as a support in fastening the display device inside the vehicle may be attached to a bottom of the display substrate of the display panel.

Referring to FIG. 2 to FIG. 4, a back plate 20 may be configured to include a base substrate 10 and an adhesive layer 15 disposed on one face of the base substrate 10. The base substrate 10 of the back plate 20 may be made of a PET film having high thermal stability and strong mechanical strength. The back plate 20 may have a releasing film 25 attached thereto via the adhesive layer 15 disposed on one face thereof and a protective film 30 attached to the other face opposite to one face of the base substrate 10 until the back plate 20 is attached to the display panel. In this regard, the releasing film 25 serves to prevent foreign substances from adhering to the adhesive layer 15 until the back plate 20 is attached to the display panel.

Next, the releasing film 25 is peeled off from the adhesive layer 15 of the back plate 20, and the protective film 30 is peeled off from the back plate 20. As shown in FIG. 3, the adhesive layer 15 of the back plate 20 is attached to the other face opposite to one face of the display panel 40 where a display area is disposed.

However, in the process of peeling the releasing film 25 from the adhesive layer 15 of the back plate 20, the adhesive layer 15 and the releasing film 25 which were in close contact with each other are separated from each other such that charges are separated into two areas, causing a phenomenon in which the electric charges are accumulated on the back plate 20. In this regard, there is a difference in an amount of static electricity generated due to a pressure applied to the releasing film 25. Especially, as an area in which the releasing film 25 remains is smaller, the pressure applied thereto increases. Thus, a charge amount relatively increases, an amount of the static electricity increases.

The static electricity as a stationary unstable charge may flow into the display panel 40 along the back plate 20 and may damage an organic light-emitting element and circuit elements for driving the organic light-emitting element. Further, when the image is displayed on the display panel 40 in a state in which the static electricity is not removed, a spot A in a form of a band may occur on a screen, as shown in FIG. 4. In particular, when the releasing film is removed along an arrow in FIG. 4, a band-shaped spot A may occur in an opposite corner as an area in which the releasing film remains is narrowed during the removal process.

The band-shaped spot A may deteriorate quality of an image provided from the vehicle display device disposed inside the vehicle, such as a vehicle dashboard or a navigation device. For example, luminance of the image supplied from the display panel may be lowered. When the luminance of the image is lowered, it is difficult to accurately provide the necessary information to the driver. This may affect reliability of the display device as well as affect stability in driving the vehicle.

Accordingly, an embodiment of the present disclosure intends to provide a display device capable of improving reliability of image quality by removing the static electricity accumulated in the process of peeling the releasing film from the adhesive layer of the back plate.

Hereinafter, a display device according to an embodiment of the present disclosure will be described with reference to the accompanying drawings.

Figure 6:
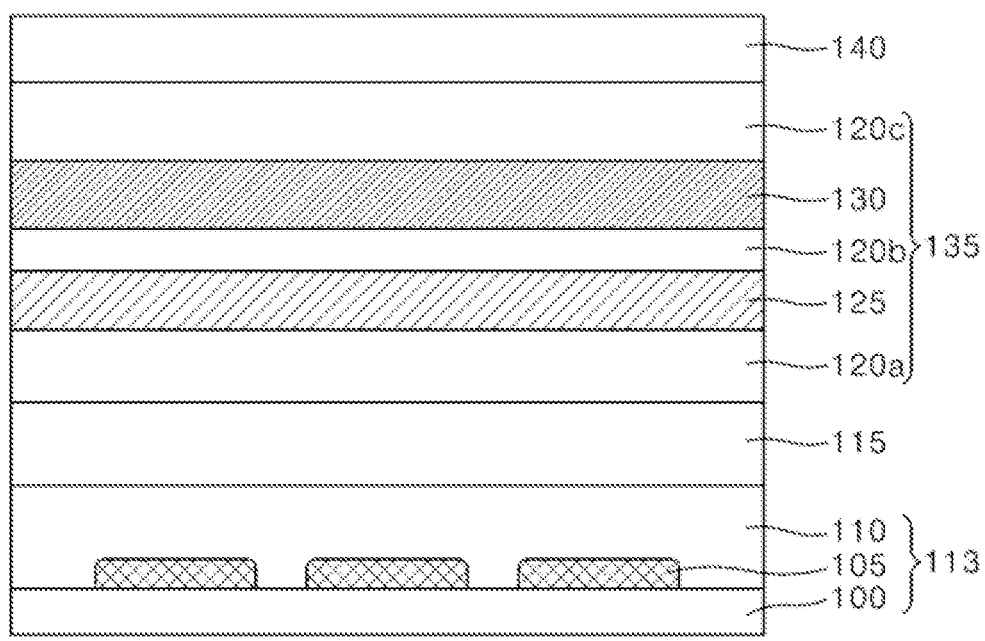
Figure 7A:
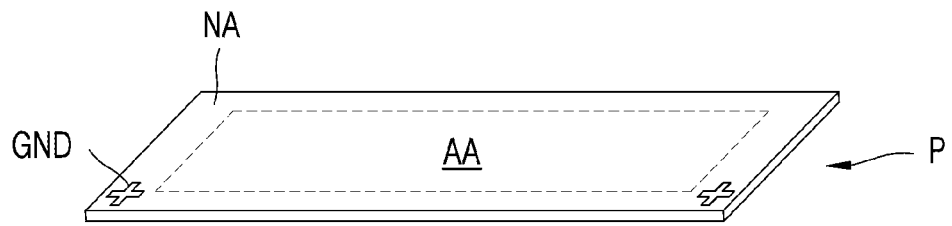
Figure 7A:
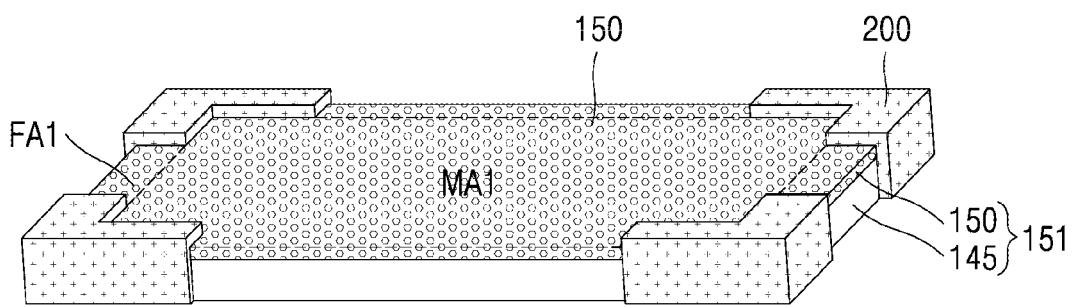
Figure 7B:
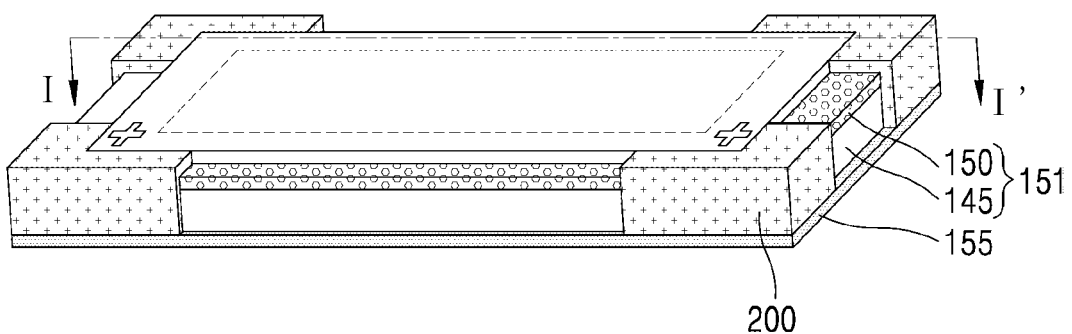
Figure 8A:
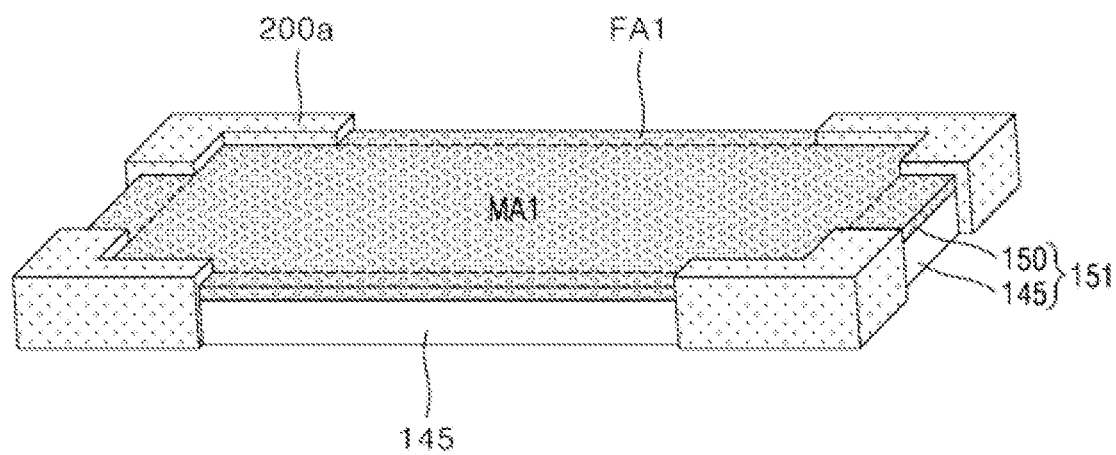
FIGS. 8A to 8C are diagrams illustrating a first ground path unit according to embodiments of the present disclosure.
Figure 8B:
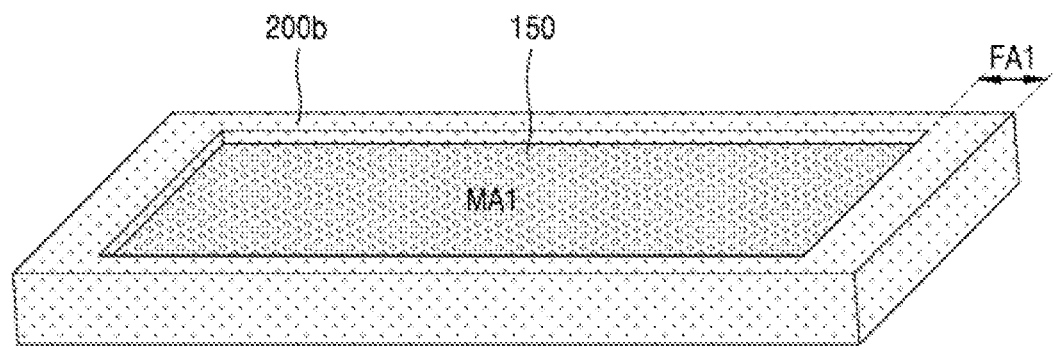
Figure 8C:
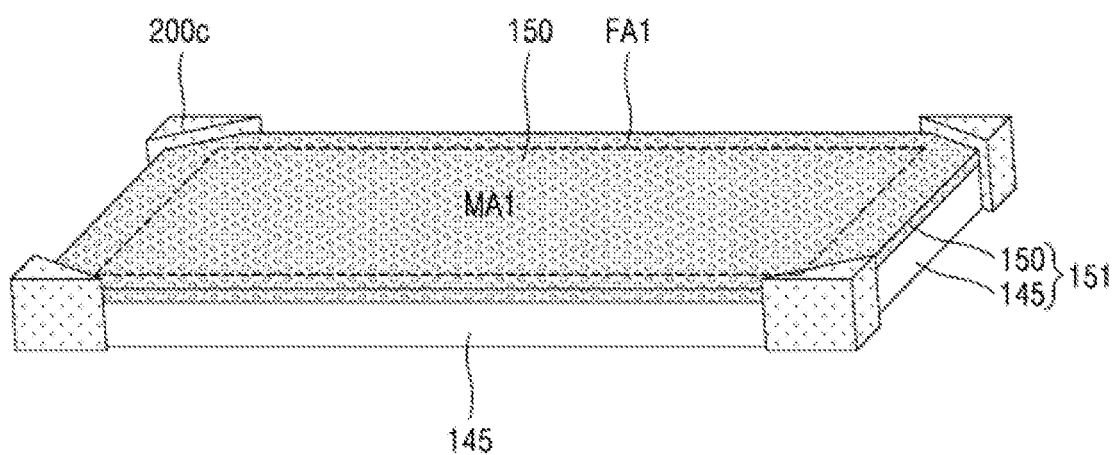
Figure 9:
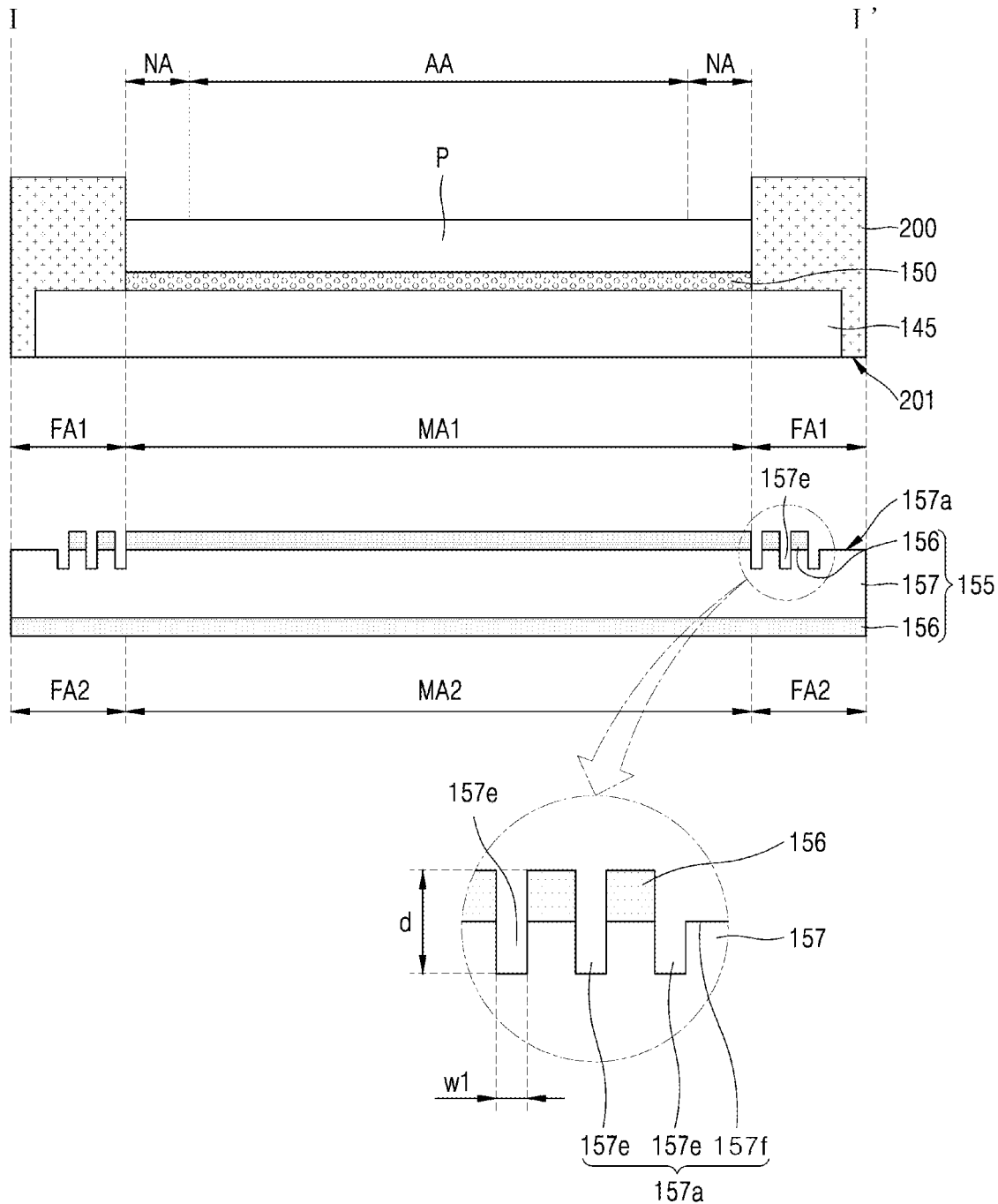
FIG. 9 is a cross-sectional view showing a display device of FIG. 7B along a I-I' direction.
Figure 10:
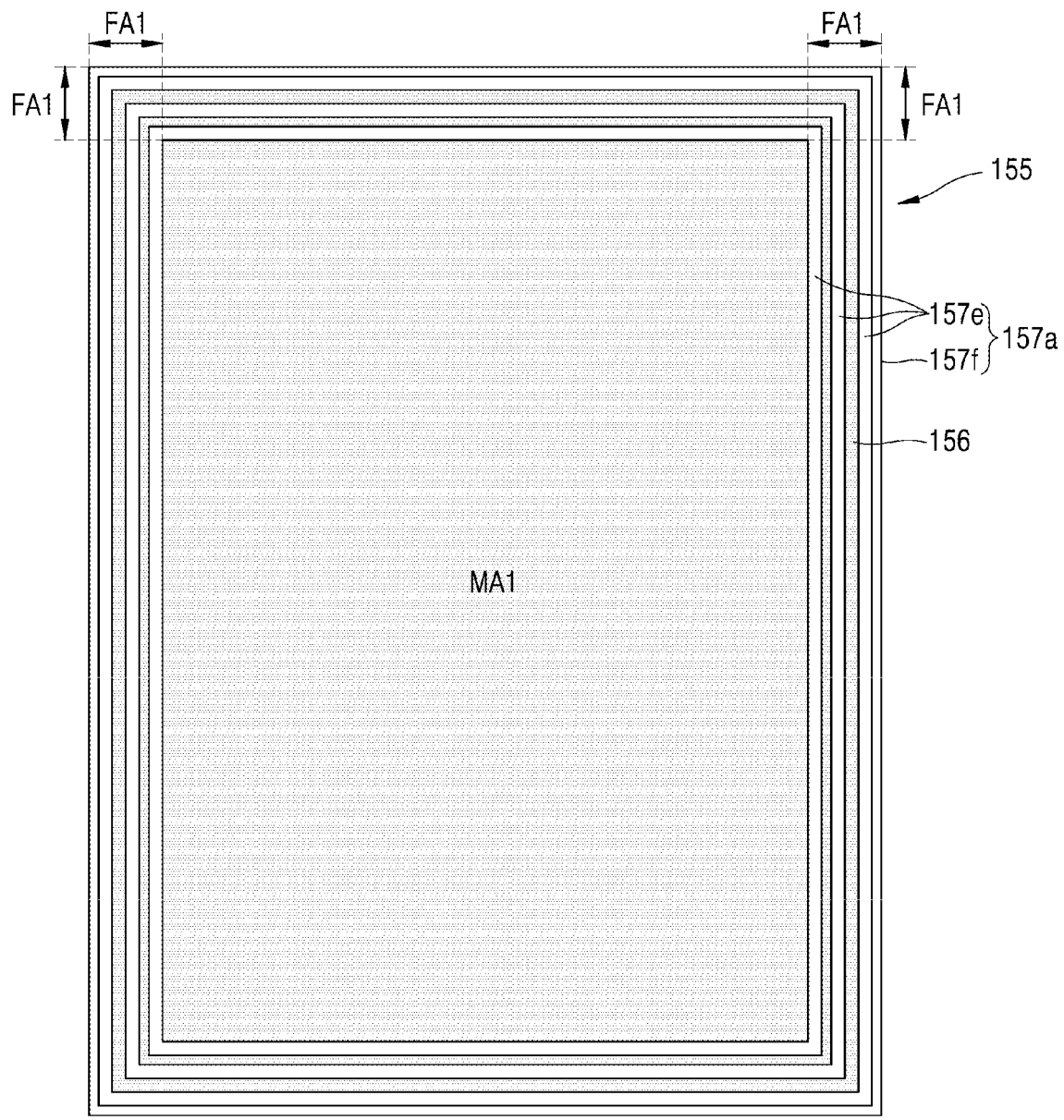
FIG. 10 is a plan view of a heat-dissipation plate of FIG. 9.
Figure 11:
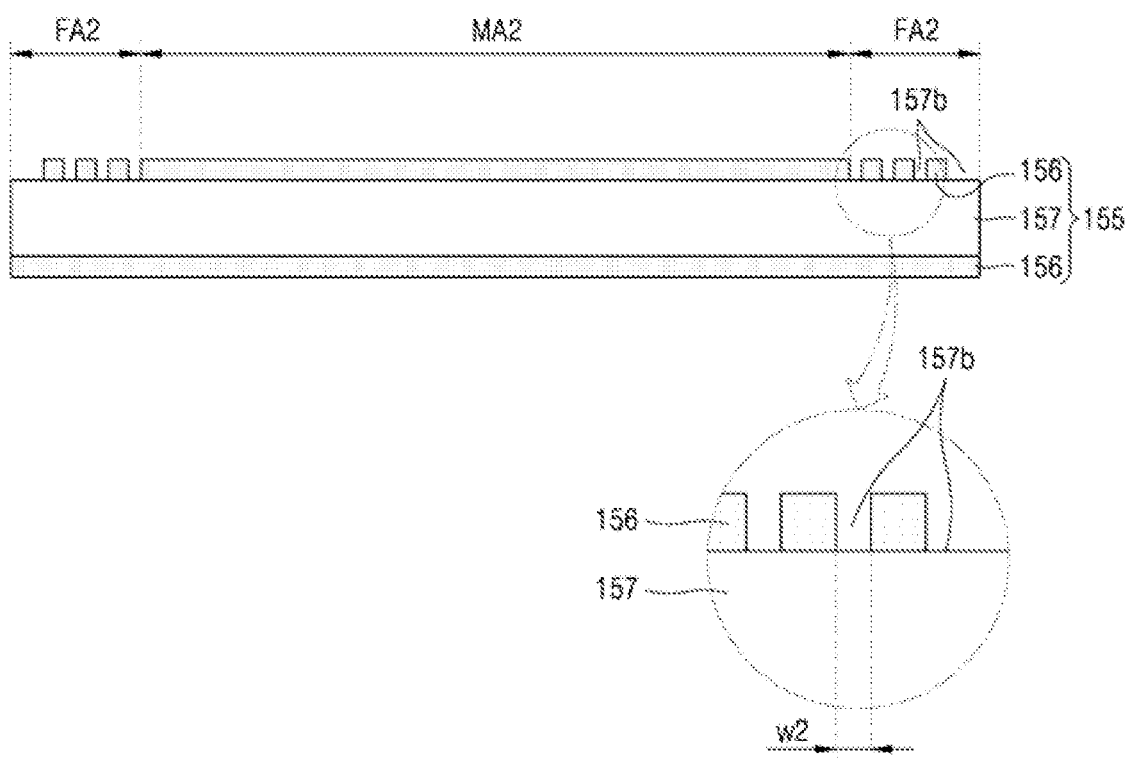
FIG. 11 is a diagram showing an example of a heat-dissipation plate.

FIG. 5 to FIG. 7B are diagrams shown to illustrate a display device according to one embodiment of the present disclosure. FIGS. 8A to 8C are diagrams illustrating a first ground path unit according to embodiments of the present disclosure. FIG. 9 is a cross-sectional view showing the display device of FIG. 7B along a I-I' direction. FIG. 10 is a plan view of a heat-dissipation plate according to the present disclosure. FIG. 11 is a diagram showing an example of a heat-dissipation plate.

Figure 5:
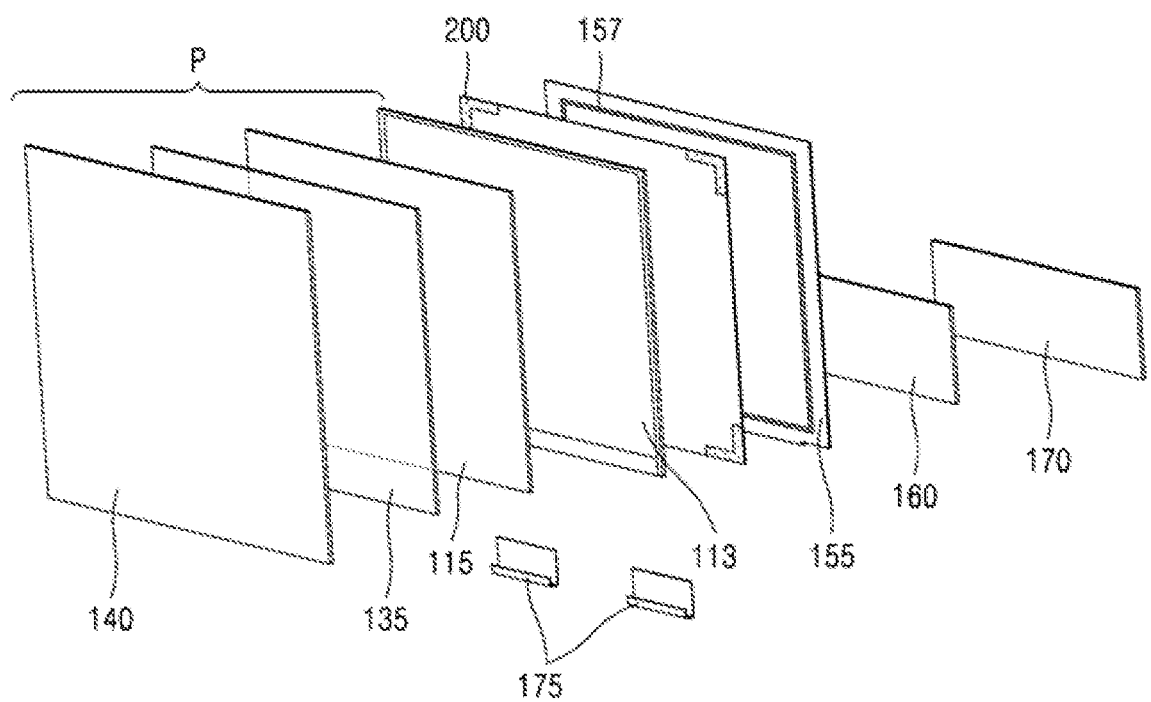
FIGS. 5 to 7B are diagrams shown to illustrate a display device according to one embodiment of the present disclosure.

In this regard, FIG. 5 is an exploded perspective view schematically showing the display device according to one embodiment of the present disclosure. FIG. 6 is an enlarged cross-sectional view of a display panel. FIG. 7A and FIG. 7B are views showing a display device having a first ground path unit and a second ground path unit.

Referring to FIGS. 5 to 7B, the display device according to one embodiment of the present disclosure may include a display panel P, a back plate 151 including a first ground path unit 200 disposed in a non-display area NA of the display panel P, and a heat-dissipation plate 155 having a second ground path unit 157a.

The display panel P may include a display area AA that display an image and the non-display area NA. The non-display area NA may be an area in which an image is not displayed, and which surrounds the display area AA. The non-display area NA may be referred to as a bezel area. A driving integrated circuit 175, etc., may be disposed in the non-display area NA of the display panel P, and a ground terminal GND may be disposed in the area NA.

In an embodiment of the present disclosure, the driving integrated circuit 175 may be embodied as a chip on film (COF) that is directly mounted on the display panel P. However, the present disclosure is not limited thereto.

The back plate 151 having the first ground path unit 200 may be disposed on a back face of the display panel P opposite to a front face thereof where the display area AA where the image is displayed is disposed. Referring to FIG. 7B, the first ground path unit 200 may be disposed so as to be in contact with each of four side faces of the display panel P.

The back plate 151 may be configured to include a base substrate 145 and an adhesive layer 150 disposed on a front face of the base substrate 145. The back plate 151 may be disposed on the back face of the display panel P so as to supplement rigidity of the display panel. For this purpose, the base substrate 145 of the back plate 151 may include a PET film having strong mechanical strength and high thermal stability. The adhesive layer 150 disposed on the front face of the base substrate 145 serves to fix the display panel P and the back plate 151 to each other.

The heat-dissipation plate 155 having the second ground path unit 157a may be disposed on the back face of the back plate 151. Further, a guide holder 160 may be disposed on a back face of the heat-dissipation plate 155. The guide holder 160 may be a component for mechanically coupling the display panel P and the vehicle dashboard (DP1, see FIG. 1), the navigation device DP2, the center fascia DP3, or the display device DP4 to which the display panel P is applied to each other. In one example, the guide holder 160 may include a space (not shown) defined in a back face thereof to which a circuit board 170 may be attached.

The circuit board 170 may be embodied as a flexible printed circuit board (FPCB), and may be attached to the guide holder 160. In an example, the circuit board 170 may be directly mounted on or attached to the display panel P.

Referring to FIG. 6 showing an enlarged display panel P, the display panel P applied to an embodiment of the present disclosure may include a light-emitting array 113. The light-emitting array 113 may include a display substrate 100 and a pixel array 105 disposed on the display substrate. The display substrate 100 may be configured to include a plastic material having flexibility, such as polyimide (PI). The pixel array 105 may be implemented in a form of various elements for displaying an image. The pixel array 105 may include a plurality of pixels 105a, 105b, and 105c that are disposed in pixel areas defined by signal lines on the display substrate 100, and display an image based on a signal supplied to the signal lines. The signal lines may include a gate line, a data line, and a pixel driving power line.

Each of the plurality of pixels 105a, 105b, and 105c may include a thin-film transistor in each pixel area, an anode electrically connected to the thin-film transistor, a light-emitting element layer formed on the anode electrode, and a cathode electrode electrically connected to the light-emitting element layer.

The thin-film transistor may include a gate electrode, a semiconductor layer, a source electrode, and a drain electrode. The semiconductor layer of the thin-film transistor may include silicon such as a-Si, poly-Si, or low-temperature poly-Si, or oxide semiconductor such as IGZO (Indium-Gallium-Zinc-Oxide).

The anode electrode may be disposed to correspond to an opening area defined according to a pattern shape of each of the pixels 105a, 105b, and 105c in each pixel area and may be electrically connected to the thin-film transistor.

The light-emitting element layer may include, for example, a plurality of organic light-emitting elements formed on the anode electrode. The organic light-emitting elements may be implemented to emit light of different colors such as red, green, and blue light from different pixels, or to emit light of the same color such as white light from the different pixels.

The cathode electrode may be commonly connected to the organic light-emitting elements of the light-emitting element layer disposed in the pixel areas. The encapsulation member 110 may be formed on the display substrate 100 so as to cover the pixel array 105, and thus may prevent oxygen, moisture, or foreign materials from invading into the organic light-emitting element of the pixel array 105. The encapsulation member 110 may be formed in a multi-layer structure in which, for example, an organic insulating material layer and an inorganic insulating material layer are alternately stacked.

A cover member 140 may be disposed on the encapsulation member 110. Because the cover member 140 includes a display area for displaying the screen, the cover member may be made of a transparent material so as to display a screen. For example, the cover member 140 may include a transparent plastic material, a glass material, or a reinforced glass material.

An optical function film 135 may be disposed between the encapsulation member 110 and the cover member 140. The optical function film 135 may have a form in which one or more functional layers are stacked. In one example, the optical function film 135 may include a polarizing film 115, a touch panel 125 and a light control film 130.

The polarizing film 115 may prevent reflection of external light to improve visibility and contrast ratio of information displayed on the display panel P. When the driver touches the display panel P with his finger, the touch panel 125 may sense a touch position and transmit the position to a system. The light control film 130 may control an angle of light emitted from the display panel P so as to prevent a viewing angle from increasing in an unnecessary direction.

Adhesive fixing members 120a, 120b, and 120c of a transparent material may be disposed between the polarizing film 115 and the touch panel 125, between the touch panel 125 and the light control film 130, and between the light control film 130 and the cover member 140, respectively. The adhesive fixing members 120a, 120b, and 120c serve to bond one or more functional layers to each other.

Each of the adhesive fixing members 120a, 120b, and 120c may be formed by applying a pressure sensitive adhesive (PSA), an optical clear adhesive (OCA) or an optical clear resin (OCR).

Referring to FIG. 7A and FIG. 7B, the back plate 151 including the first ground path unit 200 may be disposed between the display panel P and the heat-dissipation plate 155 including the second static path unit 157a. The display panel P includes the display area AA and the non-display area NA for displaying an image. A plurality of ground terminals GND may be disposed in the non-display area NA of the display panel P.

As the display panel P includes the display substrate including a flexible plastic material, the back plate 151 is placed on the back face of the display panel P, such that the display panel P is fastened to an inside of the vehicle while the shape of the display panel P is maintained.

The back plate 151 includes the base substrate 145 and the adhesive layer 150 disposed on the front face of the base substrate 145. The adhesive layer 150 may fix the display panel P and the back plate 151 to each other as shown in FIG. 9.

The back plate 151 may include a main area MA1 and an edge area FA1 surrounding the main area MA1. In one example, the main area MA1 of the back plate 151 may have the same size as a size of the display area AA of the display panel P. The edge area FA1 thereof may have the same size as that of the non-display area NA of the display panel P. However, the disclosure is not limited thereto. In an example, the main area MA1 of the back plate 151 may have at least a larger size than that of the display area AA of the display panel P.

In an embodiment of the present disclosure, the back plate 151 is shown to have a rectangular shape for convenience of illustration. However, the disclosure is not limited thereto. In an example, when the display panel P is formed to have a curved shape, the back plate 151 may also be formed to have a curved shape.

The first ground path unit 200 is disposed on the edge area FA1 of the back plate 151. The first ground path unit 200 may cover at least four corners in the edge area FA1 of the back plate 151. In this regard, the first ground path unit 200 may extend from a top face of the adhesive layer 150 of the back plate 151 toward the base substrate 145. Accordingly, a conductive section may extend from the display panel P to the base substrate 145 of the back plate 151 so as to form a ground path through which static electricity may be discharged to the outside. In one example, the first ground path unit 200 may extend to a part of the back face of the base substrate 145. Further, the first ground path unit 200 may be disposed to be in contact with an outer face of the display panel P as shown in FIG. 7B. In addition, the first ground path unit 200 has a thickness such that the first ground path unit 200 may protrude by a predefined vertical dimension from a surface of the adhesive layer 150 of the back plate 151. Description thereof will be made in detail later.

The first ground path unit 200 may include a conductive polymer material. In one example, the first ground path unit 200 may be configured to include a conductive polymer material such as a PEDOT (poly(3,4-ethy-lenedioxythiophene)) or a polymer including carbon black. In this regard, the first ground path unit 200 may be formed by applying a conductive polymer material to the edge area FA1 of the back plate 151, or may be formed by attaching a tape including a conductive polymer material to the edge area FA1.

The first ground path unit 200 may be formed to have various shapes while covering at least four corners in the edge area FA1 of the back plate 151.

FIGS. 8A to 8C show various examples of shapes of the first ground path unit according to an embodiment of the present disclosure.

Referring to FIG. 8A, the first ground path unit 200a according to an example may cover at least four corners in the edge area FA1 of the back plate 151. In a plan view, the first ground path unit 200a may have an 'L' shape or have an 'inverted L' shape. In this regard, the first ground path unit 200a may extend from a top face of each of the corners of the back plate 151 to a side face thereof. In other words, the first ground path unit 200a according to an example of FIG. 8A extends from the top face of the adhesive layer 150 of the back plate 151 toward the base substrate 145.

Furthermore, referring to FIG. 8B, the first ground path unit 200b according to an example may cover an entirety of the edge area FA1 of the back plate 151 and may be disposed to have a rectangular ring shape in a plan view. Accordingly, a surface of the adhesive layer 150 on the main area MA1 of the back plate 151 may be exposed.

Referring to FIG. 8C, the first ground path unit 200c according to an example has a triangular pattern shape in a plan view while covering at least four corners in the edge area FA1 of the back plate 151.

In other words, each of the first ground path units 200a, 200b, and 200c may be positioned in an area where the largest amount of frictional electric charges may be generated, thereby discharging the remaining charges on the back plate to the outside and thus preventing static electricity from being generated.

Further, as each of the first ground path units 200a, 200b, and 200c has a greater thickness than that of the display panel P, a vertical level of a top face thereof may be disposed to be higher than that of a top face of the display panel P, as shown in FIG. 9.

In one example, each of the first ground path units 200a, 200b, and 200c as described above is disposed in an area corresponding to the non-display area NA except for the display area AA of the display panel P. As the conductive polymer may undergo denaturation as time elapses due to chemical reaction with the adhesive layer 150 or exposure to ultraviolet (UV) light, thereby causing yellowing or greenish phenomenon.

Thus, when each of the first ground path units 200a, 200b, and 200b is disposed to extend to the display area AA, the yellowing or greenish phenomenon may be visually recognized by a viewer through the display area AA. This yellowing or greenish phenomenon may deteriorate the image quality, making it difficult to provide accurate information to the driver. Therefore, each of the first ground path units 200a, 200b, and 200b may be disposed only in the area corresponding to the non-display area NA of the display panel P, thereby preventing the quality deterioration of the display panel P due to the yellowing and greenish phenomenon.

Referring back to FIG. 9, the display panel P may be fixed to the back plate 151 via the adhesive layer 150. In this regard, as the first ground path unit 200 has a thickness greater than that of the display panel, the display panel P may be disposed at an inner side of the first ground path unit 200. Accordingly, the first ground path unit 200 may absorb and mitigate vibration or shock to be transmitted toward a side face of the display panel while the vehicle drives.

The heat-dissipation plate 155 may be disposed on the back face of the back plate 151. The heat-dissipation plate 155 may dissipate heat generated when the display panel P operates. When an image is displayed by driving the display panel P, heat may be generated from the light-emitting array (113, see FIG. 6). When such heat continuously remains on the display panel P, a color to be rendered may be changed or afterimage may occur. Accordingly, the heat-dissipation plate 155 instead of the cover member 140 or the display substrate 100 having relatively low thermal conductivity may be disposed to dissipate the heat therefrom.

The heat-dissipation plate 155 may have the same shape as that of the display panel P or the back plate 151. For example, when each of the display panel P and the back plate 151 has a rectangular shape, the heat-dissipation plate 155 is also formed to have a rectangular shape. When each of the display panel P and the back plate 151 is formed to have a curved shape, the heat-dissipation plate 155 may also be formed to have a curved shape. Further, the heat-dissipation plate 155 may have the same size as that of the display panel P or the back plate 151. The heat-dissipation plate 155 may include an edge area FA2 and a main area MA2 surrounded with the edge area FA2.

Referring to FIGS. 9 and 10, the heat-dissipation plate 155 having the second ground path unit 157a may include a structure in which a black ink layer 156 is disposed on each of top and bottom faces of a metal substrate 157. The metal substrate 157 may include, but is not limited to, aluminum (Al). The metal substrate 157 may include a metal material having high thermal conductivity, for example, gold (Au), copper (Cu), or the like. Materials having a very high thermal conductivity, above 300 W/m*K are preferred and acceptable, but the metal should also be compatible with the process to form the entire structure, therefore a material having high thermal conductive, in the range of 240 W/m*K to 300 W/m*K are preferred in some designs. The metal substrate 157 has a thickness sized such that the substrate 157 together with the back plate 151 may supplement rigidity of the display panel P including a bendable material. The black ink layer 156 may include a material that helps heat-dissipation and thus be disposed on each of both vertically opposing faces (top and bottom faces) of the metal substrate 157 to improve the heat-dissipation effect. The black ink layer 156 may be disposed to have a predefined thickness to improve the heat-dissipation effect. In one example, the black ink layer 156 may include carbon black.

The second ground path unit 157a is disposed on the edge area FA2 of the heat-dissipation plate 155. The edge area FA2 of the heat-dissipation plate 155 may be disposed to surround four sides of a main area MA2 of the heat-dissipation plate 155. In this regard, a size of the main area MA2 of the heat-dissipation plate 155 may be the same as or larger than that of the main area MA1 of the back plate 151. Further, the edge area FA2 of the heat-dissipation plate 155 may have a larger size than that of the edge area FA1 of the back plate 151.

The second ground path unit 157a may include a first part 157e and a second part 157f. The first part 157e includes a concave trench shape formed by partially removing the black ink layer 156 and the metal substrate 157. The concave trench shape of the first part 157e may have a first depth d from the surface of the metal substrate 157 of the heat-dissipation plate 155 and a first width w1. The second part 157f formed by partially removing the black ink layer 156 from the outermost part of the edge area FA2 facing to a bottom face 201 of the first ground path unit 200 to partially expose a surface of the metal substrate 157. The second part 157f of the second ground path unit 157a may be formed to partially expose the surface of the metal substrate 157 in the outermost part of the edge area FA2 of the heat-dissipation plate 155, such that the exposed surface of the metal substrate 157 may contact the bottom face 201 of the first ground path unit 200, and thus the static electricity may be discharged to the outside. In this way, a ground path through which the static electricity may be discharged is formed.

As the first part 157e of the second ground path unit 157a is formed to have the concave trench shape defined in the surface of the metal substrate 157, the surface of the metal substrate 157 may be exposed through the bottom face and both side faces of the concave trench. Accordingly, the exposed surface area of the metal substrate 157 may increase, thereby increasing the heat-dissipation effect. Further, the black ink layer 156 may remain at least in the main area MA1, thereby improving the heat-dissipation effect.

In one example, as shown in FIG. 10, the second ground path unit 157a may be disposed to extend to surround four sides and along the edge area FA2 of the heat-dissipation plate 155. The first part 157e of the second ground path unit 157a may have the concave trench shape which may include one or a plurality of trenches. Adjacent trenches of the second ground path unit 157a may be disposed to be spaced apart from each other by a predefined spacing. Accordingly, each of the plurality of trenches of the second ground path unit 157a may have a rectangular ring shape in a plan view.

The static electricity may be discharged to the outside through the ground terminal GND disposed on the display panel P via the first ground path unit 200 disposed on the back plate 151. Alternatively, a conductive section of the first ground path unit 200 may extend from the display panel P to the base substrate 145 of the back plate 151, and the bottom face 201 of the first ground path unit 200 may be connected to the second ground path unit 157a disposed on the heat-dissipation plate 151, so that the electric charges may be discharged out of the heat-dissipation plate 151. In other words, the first ground path unit 200 and the second ground path unit 157a may constitute a combined ground path through which the static electricity may be discharged to the outside The display device according to the present disclosure may stand upright inside the vehicle. In this case, vibration and impact may be applied in an upward direction from the heat-dissipation plate 155 of the display panel P to the display panel P or in a lateral direction.

As the second ground path unit 157a is formed to include the first part 157e including one or a plurality of concave trenches shape having the first width w1 and defined in the surface of the metal substrate 157, a space of a size of the first width w1 may be secured. The space defined in the trench may act as a shock-absorbing layer that may mitigate damage which may occur when the vibration and shock applied upwardly or laterally while the vehicle drives are transmitted to the light-emitting element layer of the display panel P. Accordingly, an example embodiment leaves the black ink layer 156 in the edge area FA2 of the heat-dissipation plate 155 except for the outermost part in contact with the first ground path unit 200.

When the plurality of the first parts 157e of the second ground path unit 157a are disposed in the edge area FA2 of the heat-dissipation plate 155, the first part 157e disposed adjacent to the main area MA2 of the heat-dissipation plate 155 is disposed in an area corresponding to the edge area FA1 of the back plate 155.

When the first part 157e of the second ground path unit 157a is disposed on the main area MA1 while being absent in the edge area FA1 of the back plate 155, the first part 157e may be exposed to the driver in a direction toward the display panel P. Accordingly, in some embodiments, the first part 157e of the second ground path unit 157a is disposed in an area corresponding to the edge area FA1 of the back plate 155.

FIG. 11 shows an example of the second ground path unit according to an embodiment of the present disclosure. In FIG. 11, the same reference numerals as in FIG. 10 denote the same components, and thus description thereof will be simplified.

Referring to FIG. 11, the second ground path unit 157b may have a black ink layer pattern including a plurality open areas formed by removing a surface of the black ink layer 156 of the heat-dissipation plate 155 by a second width w2 to partially expose the surface of the metal substrate. The plurality open areas may include upper surfaces having the same height. The second ground path unit 157b may act as a path for discharging static electricity to the outside through the exposed surface of the metal substrate 157. For example, as shown in FIG. 9, the static electricity may be discharged to the outside via contact between the bottom face 201 of the first ground path unit 200 and the exposed outermost part of the metal substrate 157 in the edge area FA2 of the heat-dissipation plate 155.

The second ground path unit 157b may be disposed on the edge area FA2 of the heat-dissipation plate 155 and may extend along four sides of the area FA2. At least one or more of the plurality of second ground path units 157b may be arranged horizontally and may be spaced apart from each other by a predefined spacing.

The second ground path unit 157b is disposed on the edge area FA2 of the heat-dissipation plate 155. The edge area FA2 of the heat-dissipation plate 155 may be disposed to surround four sides of the main area MA2 of the heat-dissipation plate 155. In this regard, a size of the main area MA2 of the heat-dissipation plate 155 may be the same as or larger than that of the main area MA1 of the back plate 151. Further, the edge area FA2 of the heat-dissipation plate 155 may have a larger size than that of the edge area FA1 of the back plate 151.

The second ground path unit 157b disposed on the edge area FA2 of the heat-dissipation plate 155 may be disposed in an area corresponding to the edge area FA1 of the back plate 155 such that the second ground path unit 157b is not exposed to the driver.

According to one embodiment of the present disclosure, the first ground path unit disposed on the edge area of the back plate so as not to overlap the display area of the display panel, and the second ground path unit disposed on the edge area of the heat-dissipation plate and contacting the first ground path unit may be introduced to discharge, to an outside, static electricity generated in a process of peeling a releasing film before bonding the back plate and the display panel to each other. Accordingly, the static electricity may be prevented from flowing into the display panel and thus from causing a static electricity induced spot, such that quality of the display panel may be uniform.

Further, placing the first ground path unit on an edge area of the back plate so as not to overlap the display area of the display panel may provide an advantage of preventing yellowing or greenish phenomenon of the display panel. Further, a plurality of the second ground path units having a concave trench shape may be formed in a metal substrate of the heat-dissipation plate, thereby increasing an exposed surface area of the metal substrate and thus improving the heat-dissipation effect.

In addition, the plurality of the second ground path units having a concave trench shape may be formed in the metal substrate of the heat-dissipation plate, thereby preventing or reducing vibration and shock from being transmitted to a light-emitting element layer of the display panel. In addition, the first ground path unit may have a greater thickness than that of the display panel, and the display panel may be disposed at an inner side of the first ground path unit, thereby absorbing and alleviating the vibration or shock transmitted toward a side face of the display panel while the vehicle drives.

A scope of protection of the present disclosure should be construed by the scope of the claims, and all technical ideas within the scope equivalent thereto should be construed as being included in the scope of the present disclosure.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a display panel including a display area and a non-display area surrounding the display area;
a back plate disposed on a back face of the display panel, the back plate including a first ground path unit and including a main area and an edge area surrounding the main area; and
a heat-dissipation plate disposed on a back face of the back plate and including a second ground path unit,
wherein the first ground path unit is disposed in the edge area of the back plate,
wherein the first ground path unit extends from a top face of the back plate toward the back face of the back plate,
wherein the first ground path unit is in contact with at least one of four side faces of the display panel, and
wherein the second ground path unit is electrically connected to the first ground path unit.

2. The display device of claim 1, wherein the first ground path unit is in contact with each of the four side faces of the display panel.

3. The display device of claim 1, wherein the main area of the back plate vertically overlapping the display area of the display panel, and
wherein the first ground path unit includes a conductive polymer material.

4. The display device of claim 3, wherein the first ground path unit is disposed in the edge area and extends from a top face to a back face of each of corners of the back plate, wherein the first ground path unit has an L shape or an inverted L shape in a plan view of the display device.

5. The display device of claim 3, wherein the first ground path unit covers an entirety of the edge area and extends from the top face of the back plate to the back face of the back plate.

6. The display device of claim 5, wherein the first ground path unit has a rectangular ring shape in a plan view of the display device and exposes the main area of the back plate.

7. The display device of claim 3, wherein the first ground path unit has a triangular shape in a plan view of the display device, and extends from a top face to a back face of each of corners of the back plate.

8. The display device of claim 1, wherein the first ground path unit has a thickness greater than a thickness of the display panel so that a vertical level of a top face of the first ground path unit is higher than a vertical level of a top face of the display panel.

9. The display device of claim 1, wherein the heat-dissipation plate includes a metal substrate, and a black ink layer disposed on each of bottom and top faces of the metal substrate,
wherein the heat-dissipation plate has a main area vertically overlapping the display area of the display panel, and an edge area surrounding the main area thereof, and
wherein the second ground path unit is disposed in the edge area of the heat-dissipation plate, vertically offsets from the main area thereof, and includes a metal material having high thermal conductivity.

10. The display device of claim 9, wherein the second ground path unit includes:
a first part that includes a plurality of trenches each having a first depth and a first width and disposed in a surface of the metal substrate; and
a second part disposed over an outmost part of the edge area of the heat-dissipation plate,
wherein the second part exposes a top face of the metal substrate,
wherein a surface of the metal substrate is exposed through a bottom face and both side faces of a trench of the first part positioned below the top face of the metal substrate.

11. The display device of claim 10, the trenches of the first part are disposed in the edge area of the heat-dissipation plate,
wherein the trenches of the first part extend along four sides of the edge area, and
wherein the trenches of the first part are arranged horizontally and are spaced apart from each other.

12. The display device of claim 11, wherein each of the plurality of the trenches has a rectangular ring shape in a plan view of the display device, and wherein the plurality of the trenches are spaced apart from each other.

13. The display device of claim 9, wherein the second ground path unit includes a black ink layer pattern including an open area partially exposing a surface of the metal substrate.

* * * * *